United States Patent
Koo et al.

(10) Patent No.: US 9,412,771 B2
(45) Date of Patent: Aug. 9, 2016

(54) METHOD OF MANUFACTURING THIN FILM TRANSISTOR AND METHOD OF MANUFACTURING DISPLAY SUBSTRATE HAVING THE SAME

(71) Applicant: Samsung Display Co., Ltd, Yongin, Gyeonggi-Do (KR)

(72) Inventors: Soyoung Koo, Yongin-si (KR); Myounghwa Kim, Seoul (KR); Sangho Park, Suwon-si (KR); Jun Hyung Lim, Seoul (KR); Masataka Kano, Hwaseong-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/793,966

(22) Filed: Jul. 8, 2015

(65) Prior Publication Data

US 2016/0013257 A1    Jan. 14, 2016

(30) Foreign Application Priority Data

Jul. 9, 2014 (KR) ........................ 10-2014-0086195

(51) Int. Cl.

| H01L 21/00 | (2006.01) |
|---|---|
| H01L 27/12 | (2006.01) |
| H01L 29/66 | (2006.01) |
| H01L 21/02 | (2006.01) |
| H01L 21/477 | (2006.01) |
| H01L 29/24 | (2006.01) |

(52) U.S. Cl.
CPC ...... *H01L 27/1262* (2013.01); *H01L 21/02554* (2013.01); *H01L 21/02565* (2013.01); *H01L 21/02664* (2013.01); *H01L 21/477* (2013.01); *H01L 29/24* (2013.01); *H01L 29/66969* (2013.01); *H01L 2227/323* (2013.01)

(58) Field of Classification Search
CPC ............ H01L 21/02565; H01L 21/477; H01L 21/02664; H01L 21/02554
See application file for complete search history.

(56) References Cited

U.S. PATENT DOCUMENTS

| 2008/0197350 A1* | 8/2008 | Park ................... H01L 29/7869 257/43 |
| 2012/0052625 A1 | 3/2012 | Yamazaki |
| 2016/0027887 A1* | 1/2016 | Yuan ................. H01L 29/78696 257/43 |

FOREIGN PATENT DOCUMENTS

| KR | 10-2011-0071641 A | 6/2011 |
| KR | 10-2012-0128274 A | 11/2012 |
| KR | 10-2013-0086163 A | 7/2013 |

* cited by examiner

*Primary Examiner* — Richard Booth
(74) *Attorney, Agent, or Firm* — Knobbe Martens Olson & Bear LLP

(57) ABSTRACT

A method of manufacturing a thin film transistor and a method of manufacturing a display substrate having the same are disclosed. In one aspect, the method of manufacturing a thin film transistor comprises forming an oxide semiconductor layer over a substrate, plasma-treating the oxide semiconductor layer with a plasma generated from a nitrogen gas or a nitric oxide gas so as to decrease defects in the oxide semiconductor layer, and annealing the plasma-treated oxide semiconductor layer to form a channel layer.

21 Claims, 15 Drawing Sheets

METHOD OF MANUFACTURING THIN FILM TRANSISTOR AND METHOD OF MANUFACTURING DISPLAY SUBSTRATE HAVING THE SAME

CROSS-REFERENCE TO RELATED APPLICATIONS

This U.S. non-provisional patent application claims priority under 35 U.S.C. §119 of Korean Patent Application No. 10-2014-0086195, filed on Jul. 9, 2014, the contents of which are hereby incorporated by reference in its entirety.

BACKGROUND

1. Field

The described technology generally relates to a method of manufacturing a thin film transistor and a method of manufacturing a display substrate having the same.

2. Description of the Related Technology

A display substrate includes thin film transistors. The thin film transistors are disposed that are formed in a display area of the display substrate and used as switching device to drive pixels. In addition, the thin film transistors are used as driving devices included in a driving circuit formed on the display substrate.

Each thin film transistor includes a channel layer having a channel through which charge carriers move and being formed of a variety of semiconductor materials. The thin film transistor has a field-effect mobility that varies depending on an electrical property of the semiconductor material used to form the channel layer.

SUMMARY OF CERTAIN INVENTIVE ASPECTS

The present disclosure provides a method of manufacturing a thin film transistor including an amorphous silicon oxide semiconductor layer with improved mobility.

The present disclosure provides a method of manufacturing a display substrate having the thin film transistor.

Embodiments of the inventive concept provide a method of manufacturing a thin film transistor, including forming an oxide semiconductor layer on a base substrate, plasma-treating the oxide semiconductor layer using a plasma generated from a nitrogen gas or a nitric oxide gas to decrease defects in the oxide semiconductor layer, and annealing the plasma-treated oxide semiconductor layer to form a channel layer from the plasma-treated oxide semiconductor layer.

The oxide semiconductor layer includes an amorphous oxide semiconductor material and the channel layer includes the amorphous oxide semiconductor material.

The annealing is performed at a temperature of about 400° C. or less.

The oxide semiconductor layer includes indium, gallium, zinc, tin, or an oxide thereof.

The forming of the oxide semiconductor layer and the plasma-treating of the oxide semiconductor layer are performed using a plasma enhanced chemical vapor deposition apparatus.

The method further includes forming a gate electrode on the channel layer and forming a source electrode and a drain electrode, which are electrically connected to the channel layer.

The method further includes forming a gate electrode on the base substrate before the forming of the oxide semiconductor layer and forming a source electrode and a drain electrode, which are electrically connected to the channel layer.

The method further includes forming an etch stopper on the channel layer before the forming of the source electrode and the drain electrode, and the etch stopper is partially exposed through between the source electrode and the drain electrode.

Embodiments of the inventive concept provide a method of manufacturing a display substrate, including forming a thin film transistor on a base substrate and forming a display element on the base substrate, the display element being connected to the thin film transistor. The forming of the thin film transistor includes forming an oxide semiconductor layer on the base substrate, plasma-treating the oxide semiconductor layer using a plasma generated from a nitrogen gas or a nitric oxide gas to decrease defects in the oxide semiconductor layer, and annealing the plasma-treated oxide semiconductor layer to form a channel layer from the plasma-treated oxide semiconductor layer.

Each of the oxide semiconductor layer and the channel layer includes an amorphous oxide semiconductor material.

The annealing is performed at a temperature of about 400° C. or less.

The method further includes forming a gate electrode on the base substrate before the forming of the oxide semiconductor layer and forming a source electrode and a drain electrode, which are electrically connected to the channel layer.

The forming of the display element includes forming a pixel electrode on the thin film transistor and the pixel electrode is electrically connected to the drain electrode.

The method further includes forming a gate electrode on the channel layer to overlap with the channel layer and forming a source electrode and a drain electrode, which are electrically connected to the channel layer.

The forming of the display element includes forming an organic light emitting diode on the thin film transistor and the organic light emitting diode is electrically connected to the drain electrode.

Another aspect is a method of manufacturing a thin film transistor for a display device, the method comprising forming an oxide semiconductor layer on a substrate, plasma-treating the oxide semiconductor layer with a plasma generated from a nitrogen gas or a nitric oxide gas so as to decrease defects in the oxide semiconductor layer, and annealing the plasma-treated oxide semiconductor layer to form a channel layer.

In the above method, the oxide semiconductor layer comprises an amorphous oxide semiconductor material and the channel layer comprises the amorphous oxide semiconductor material.

In the above method, the annealing is performed at a temperature of about 400° C. or less.

In the above method, the oxide semiconductor layer comprises indium, gallium, zinc, tin, or an oxide thereof.

In the above method, the forming of the oxide semiconductor layer and the plasma-treating of the oxide semiconductor layer are performed using a plasma enhanced chemical vapor deposition apparatus.

The above method further comprises forming a gate electrode on the channel layer and forming source and drain electrodes electrically connected to the channel layer.

The above method further comprises forming a gate electrode over the substrate before the forming of the oxide semiconductor layer. The above method further comprises forming source and drain electrodes electrically connected to the channel layer.

The above method further comprises forming an etch stopper on the channel layer before the forming of the source and drain electrodes, wherein the etch stopper is partially exposed between the source electrode and the drain electrode.

Another aspect is a method of manufacturing a display substrate, the method comprising forming a thin film transistor on a substrate and forming a display element on the substrate, wherein the display element is electrically connected to the TFT. The forming of the TFT comprises forming an oxide semiconductor layer on the substrate, plasma-treating the oxide semiconductor layer using a plasma generated from a nitrogen gas or a nitric oxide gas to decrease defects in the oxide semiconductor layer, and annealing the plasma-treated oxide semiconductor layer to form a channel layer.

In the above method, each of the oxide semiconductor layer and the channel layer is formed of an amorphous oxide semiconductor material.

In the above method, the annealing is performed at a temperature of about 400° C. or less.

The above method further comprises forming a gate electrode on the substrate before the forming of the oxide semiconductor layer. The above method further comprises forming source and drain electrodes electrically connected to the channel layer.

In the above method, the forming of the display element comprises forming a pixel electrode on the TFT, wherein the pixel electrode is electrically connected to the drain electrode.

The above method further comprises forming a gate electrode on the channel layer so as to overlap with the channel layer and forming source and drain electrodes electrically connected to the channel layer.

In the above method, the forming of the display element comprises forming an organic light-emitting diode on the TFT, wherein the organic light-emitting diode is electrically connected to the drain electrode.

Another aspect is a method of manufacturing a thin film transistor for a display device, the method comprising forming an oxide semiconductor layer on a substrate in a chamber, injecting nitrogen gas or nitric oxide gas into the chamber, plasma-treating the oxide semiconductor layer with a plasma generated from the nitrogen gas or the nitric oxide gas, and annealing the plasma-treated oxide semiconductor layer to form a channel layer. The forming, injecting, plasma-treating and annealing are performed without removing the substrate from the chamber.

In the above method, each of the oxide semiconductor layer and the channel layer is formed of an amorphous oxide semiconductor material.

In the above method, the annealing is performed at a temperature of about 400° C. or less.

The above method further comprises forming a gate electrode over the substrate before the forming of the oxide semiconductor layer. The above method further comprises forming source and drain electrodes electrically connected to the channel layer.

The above method further comprises forming an etch stopper over the channel layer before the forming of the source and drain electrodes, wherein the etch stopper is partially exposed between the source electrode and the drain electrode.

According to at least one of the disclosed embodiments, the charge carrier mobility of the thin film transistor can be improved without changing the material for the thin film transistor.

The manufacturing method of the thin film transistor includes the plasma treatment process, and thus the defects in the oxide semiconductor layer are reduced. In addition, since the plasma-treated oxide semiconductor layer is annealed, the charge carrier mobility in the channel layer is more improved than when the oxide semiconductor layer is not plasma-treated.

The plasma treatment process is performed in the same chamber in which the oxide semiconductor layer is formed, so that manufacturing cost and time of the thin film transistor are reduced.

In addition, since the plasma treatment process is performed on the oxide semiconductor layer, the charge carrier mobility can be controlled even though the annealing process is performed at a temperature lower than a crystallization temperature. Thus, the charge carrier mobility can be improved without changing the amorphous-crystalline structure.

DETAILED DESCRIPTION OF CERTAIN INVENTIVE EMBODIMENTS

Figure 1:
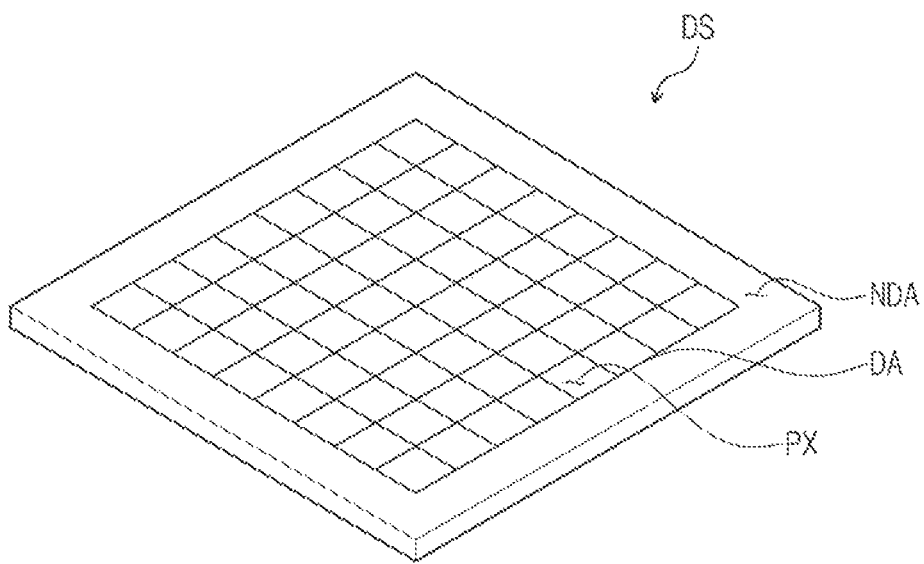
FIG. 1 is a perspective view showing a display panel according to an exemplary embodiment.

It will be understood that when an element or layer is referred to as being "on", "connected to" or "coupled to" another element or layer, it can be directly on, connected or coupled to the other element or layer or intervening elements or layers can be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. can be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the described technology.

Spatially relative terms, such as "beneath", "below", "lower", "above", "upper" and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device can be otherwise oriented (rotated 90 degrees or at other orientations) and the spatially relative descriptors used herein interpreted accordingly.

The terminology used herein is for the purpose of describing particular embodiments only and is not intended to be limiting of the described technology. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this described technology belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the described technology will be explained in detail with reference to the accompanying drawings. In this disclosure, the term "substantially" includes the meanings of completely, almost completely or to any significant degree under some applications and in accordance with those skilled in the art. Moreover, "formed on" can also mean "formed over." The term "connected" can include an electrical connection.

Figure 2A:
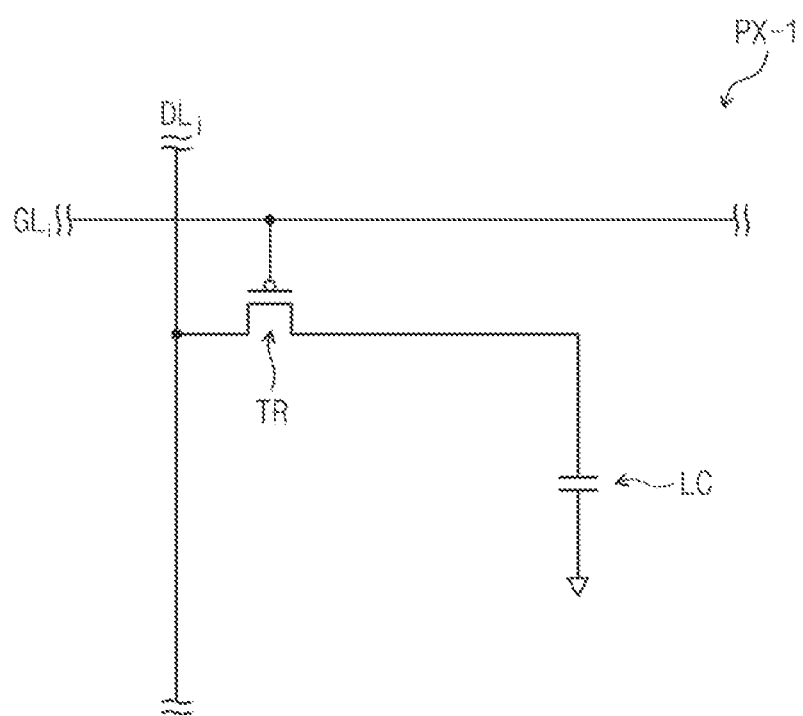
FIG. 2A is an equivalent circuit diagram showing a pixel according to an exemplary embodiment.
Figure 2B:
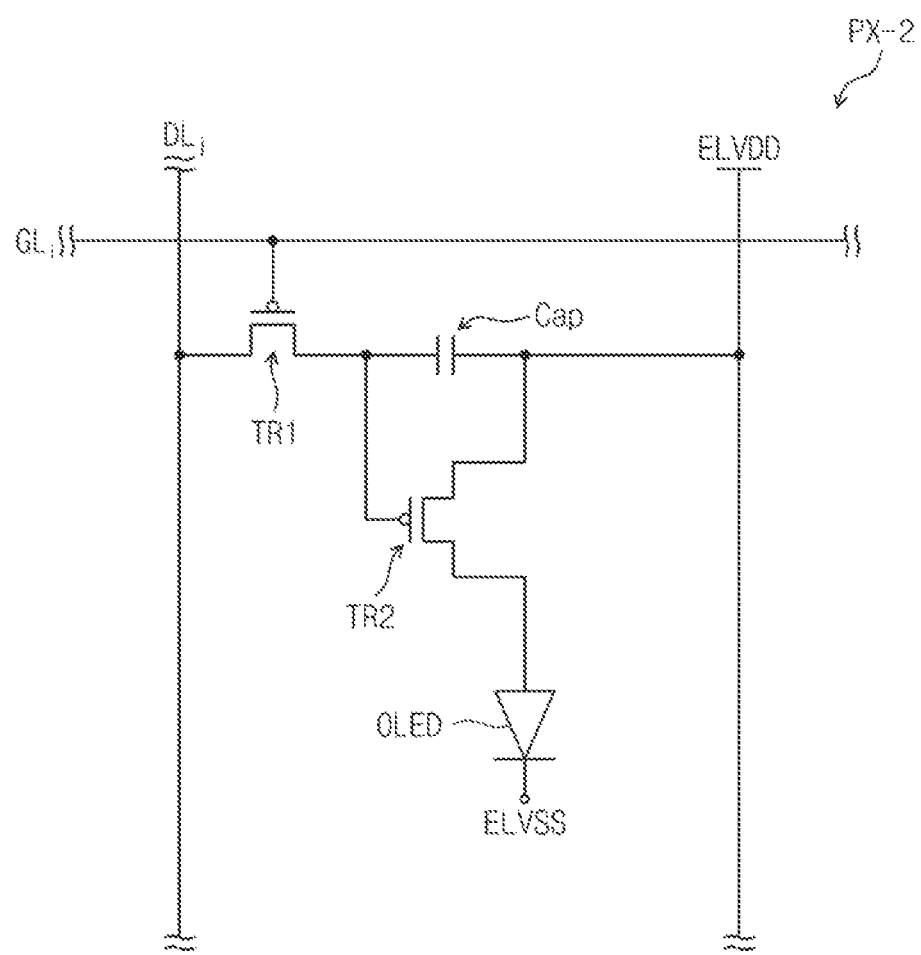
FIG. 2B is an equivalent circuit diagram showing a pixel according to an exemplary embodiment.

FIG. 1 is a perspective view showing a display panel DS according to an exemplary embodiment. FIG. 2A is an equivalent circuit diagram showing a pixel according to an exemplary embodiment. FIG. 2B is an equivalent circuit diagram showing a pixel according to an exemplary embodiment.

Referring to FIG. 1, the display panel DS includes a display area DA and a non-display area NDA formed adjacent to the display area DA. The display area DA displays an image based at least in on electrical signals. The non-display area NDA includes a driving circuit that applies the electrical signals to the display area DA.

The display panel DS includes a plurality of pixels PX. The pixels PX are arranged in the display area DA. The pixels PX are arranged in a matrix form. The pixels PX are connected to a plurality of signal lines (not shown) and operated based at least in on signals provided through the signal lines.

The display panel DS can be a variety of display panels, such as a liquid crystal display panel, an organic light emitting display panel, an electrophoretic display panel, an electrowetting display panel, etc.

Although not shown in the figures, the display panel DS includes at least one display substrate. For instance, when the display panel DS is the LCD panel, the display panel DS includes two display substrates of a thin film transistor substrate and a color filter substrate. When the display panel DS is the organic light emitting display panel, the display panel DS includes only one display substrate.

Referring to FIGS. 2A and 2B, each pixel PX includes a thin film transistor TR and a display element. The thin film transistor TR is turned on or turned off based at least in on a gate signal applied to a gate line GLi connected thereto. The thin film transistor TR outputs a data signal applied to a data line DLj connected thereto. The thin film transistor TR applies the data signal to the display element.

The display element is electrically connected to the thin film transistor TR. The display element is operated based at least in on the data signal provided from the thin film transistor TR. The display panel DS can include various display elements.

Referring to FIG. 2A, a pixel PX-1 includes a liquid crystal capacitor LC as the display element. The liquid crystal capacitor LC includes a first electrode connected to the thin film transistor TR and a second electrode facing the first electrode.

The liquid crystal capacitor LC is charged with a certain amount of electric charge, which corresponds to a difference between a data voltage corresponding to the data signal from the thin film transistor and a voltage applied to the second electrode. The liquid crystal capacitor LC controls an amount of light transmitting therethrough in accordance with the amount of electric charge, and thus the display panel DS displays the image corresponding to the amount of the light transmitting through the liquid crystal capacitor LC.

Referring to FIG. 2B, a pixel PX-2 includes an organic light emitting diode OLED as the display element. The pixel PX-2 includes a first thin film transistor TR1, a second thin film transistor TR2, a capacitor Cap, and an organic light emitting diode OLED.

The first thin film transistor TR1 outputs the data signal applied to the data line DLj based at least in on the gate signal applied to the gate line GLi. The capacitor Cap includes a first electrode connected to the first thin film transistor TR1 and a second electrode connected to a power source line ELVDD. The capacitor Cap is charged with a certain amount of electric charge, which corresponds to a difference between the voltage corresponding to the data signal and a power source voltage applied to the power source line ELVDD.

The second thin film transistor TR2 is electrically connected to the first thin film transistor TR1, the capacitor Cap, and the organic light emitting diode OLED.

The second thin film transistor TR2 controls a driving current flowing through the organic light emitting diode OLED based at least in on the amount of electric charge charged in the capacitor Cap. In addition, a turn-on time period of the second thin film transistor TR2 is determined based at least in on the amount of electric charge charged in the capacitor Cap.

The organic light emitting diode OLED includes at least one organic layer. The organic light emitting diode OLED is a self-emissive device that emits the light and is based at least in on the driving current. In addition, the organic light emitting diode OLED emits the light during the turn-on time period of the second thin film transistor TR2.

The organic light emitting diode OLED emits a variety of color lights according to a material included in the organic light emitting layer. For instance, the organic light emitting diode OLED emits a red, green, blue, or white light.

The organic light emitting diode OLED includes at least one organic light emitting layer. The organic light emitting diode OLED controls a light emission amount therefrom based at least in on the data signal and the display panel DS displays the image corresponding to the light emitted from the organic light emitting diode OLED.

Meanwhile, the display element of the display panel DS according to the present exemplary embodiment should not be limited to the pixels PX-1 and PX-2. In addition, the thin film transistor TR can be disposed not only in the display area DA but also in the non-display area NDA.

For instance, the thin film transistor may be provided as a part of the driving circuit formed in the non-display area NDA. The thin film transistor according to the present exemplary embodiment can be disposed in a variety of areas of the display panel DS.

Figure 3:
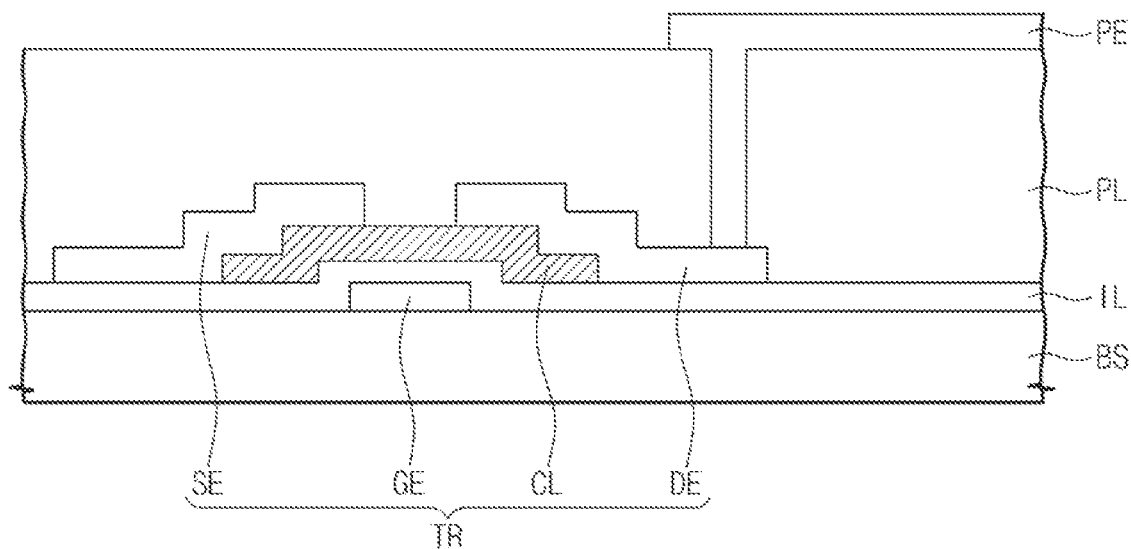
FIG. 3 is a cross-sectional view showing a portion of a display substrate according to an exemplary embodiment.

FIG. 3 is a cross-sectional view showing a portion of a display substrate according to an exemplary embodiment. The display substrate serves as a part of the display panel and includes a thin film transistor TR and a display pixel PE. The thin film transistor TR can serve as the thin film transistors TR1, TR2, and TR3 shown in FIGS. 2A and 2B.

Referring to FIG. 3, the thin film transistor TR includes a gate electrode GE, a channel layer CL, a source electrode SE, and a drain electrode DE. In the present exemplary embodiment, a p-type thin film transistor will be described as the thin film transistor TR, but the thin film transistor TR should not be limited to the p-type thin film transistor.

The gate electrode GE is disposed on a base substrate BS. The base substrate BS can be a glass substrate or a plastic substrate. Although not shown in figures, the gate electrode GE is connected to the gate line GLi (refer to FIGS. 2A and 2B) and receives the gate signal to turn on or off the thin film transistor TR.

A gate insulating layer IL is disposed on the gate electrode GE. The gate insulating layer IL insulates the gate electrode GE and the gate line from other elements. The gate insulating layer IL is an organic or inorganic layer and has a single- or multi-layer structure.

The channel layer CL is disposed on the gate electrode GE. Although not shown in the figures, a channel is formed in the channel layer CL to overlap with the gate electrode GE.

The channel layer CL includes an oxide semiconductor material. The oxide semiconductor material includes at least one of indium (In), gallium (Ga), zinc (Zn), and tin (Sn).

The channel layer CL has a field-effect charge carrier mobility (hereinafter, referred to as mobility). The channel layer CL includes the channel formed therein, which serves as a path through which the electric charges move. As the mobility becomes high, the electric charges easily move in the channel based at least in on the voltage applied thereto. In addition, as the mobility of the channel layer CL becomes high, a driving speed of the thin film transistor TR becomes fast. The driving speed of the thin film transistor TR affects a response speed of the display substrate.

The channel layer CL has an amorphous-crystalline structure. For instance, the channel layer CL includes amorphous indium tin zinc oxide (a-ITZO) or amorphous indium gallium zinc oxide (a-IGZO), but it should not be limited thereto or thereby.

Although the channel layer CL has the amorphous-crystalline structure, the channel layer has a mobility higher than that of an oxide semiconductor layer with a typical amorphous-crystalline structure. This is because the channel layer CL is plasma treated to reduce defects in the channel layer CL. This will be described in detail later.

The source electrode SE and the drain electrode DE are disposed on the channel layer CL. Although not shown in figures, the source electrode SE is connected to the data line DLj (refer to FIGS. 2A and 2B) and the drain electrode DE is connected to the display element.

When the thin film transistor is turned on based at least in on the gate signal, the channel is formed in the channel layer CL to overlap with the gate electrode GE. The electric charges in the channel layer CL move along the channel based at least in part on the data signal. Accordingly, the driving current corresponding to the data signal flows from the source electrode SE to the drain electrode DE, and thus the data signal is applied to the drain electrode DE.

The display electrode PE is disposed on the thin film transistor TR. A protective layer PL is disposed between the thin film transistor TR and the display electrode PE to protect the thin film transistor TR. The protective layer PL is an organic or inorganic layer and has a single- or multi-layer structure.

The display electrode PE serves as a part of the display element. For instance, the display electrode PE can be, but not limited to, a pixel electrode of the liquid crystal capacitor LC shown in FIG. 2A. In this case, the display substrate can be the thin film transistor. The display panel DS is configured to include the display substrate and the color filter substrate.

As another example, the display electrode PE may be, but not limited to, an anode of the organic light emitting diode OLED shown in FIG. 2B. Organic layers including at least the organic light emitting layer can be sequentially stacked on the display electrode PE. A cathode is disposed on the entire surface of the display substrate to face the anode. Therefore, the display panel DS is configured to include only one display substrate.

Figure 4A:
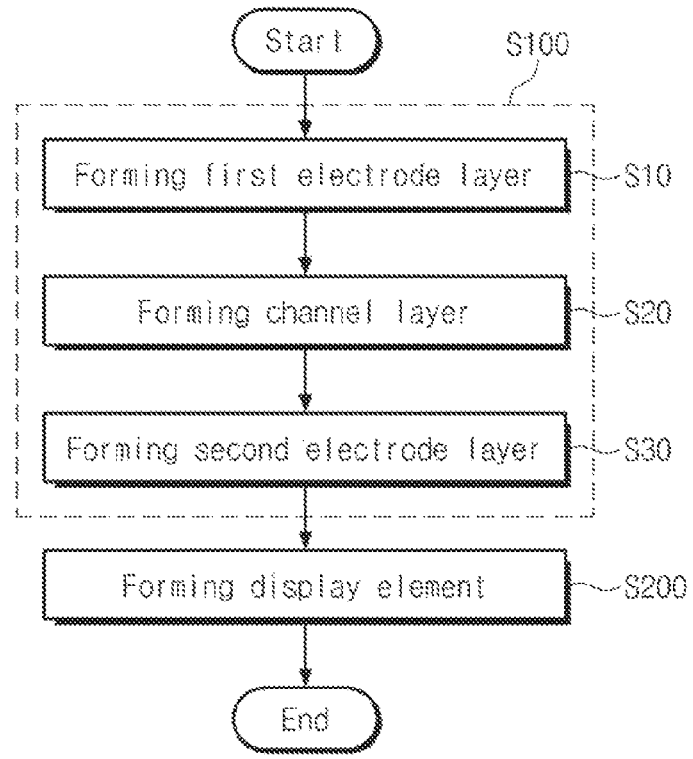
FIGS. 4A and 4B are flowcharts showing a manufacturing method of a display substrate according to an exemplary embodiment.
Figure 4B:
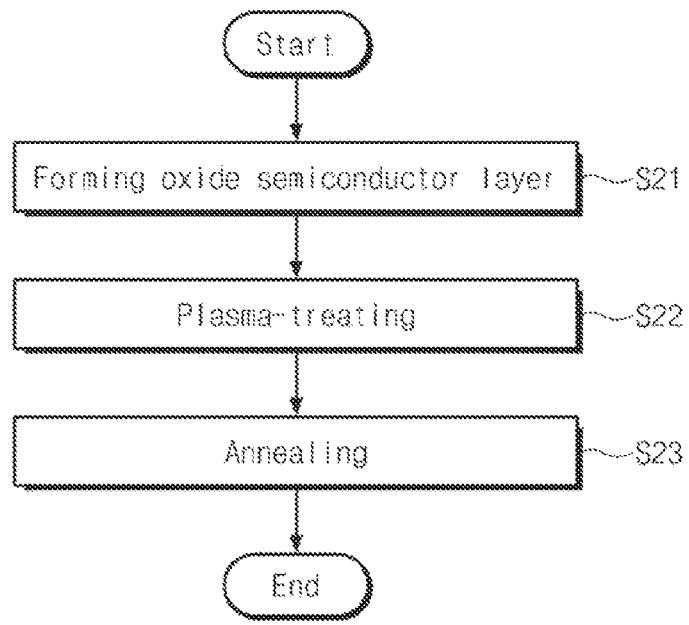

FIGS. 4A and 4B are flowcharts showing a manufacturing method of a display substrate according to an exemplary embodiment. Hereinafter, a manufacturing method of the thin film transistor and a manufacturing method of the display substrate will be described in detail with reference to FIGS. 4A and 4B. Depending on the embodiment, additional states can be added, others removed, or the order of the states changed in FIGS. 4A and 4B.

Referring to FIG. 4A, the manufacturing method of the display substrate includes a manufacturing process (S100) for the thin film transistor and a manufacturing process (S200) for the display electrode.

The manufacturing process (S100) of the thin film transistor includes forming a first electrode layer on a base substrate (S10), forming the channel layer on the first electrode layer (S20), and forming a second electrode layer on the channel layer (S30).

Meanwhile, the order of the forming of the first electrode layer (S10) and the forming of the channel layer (S20) should not be limited thereto or thereby according to the structure of the thin film transistor. For instance, the forming of the first electrode layer (S10) can be performed after the forming of the channel layer (S20) is performed.

Referring to FIG. 4B, the forming of the channel layer (S20) includes forming the oxide semiconductor layer on the base substrate (S21), plasma-treating the oxide semiconductor layer (S22), and heat-treating the plasma-treated oxide semiconductor layer (S23).

In the forming of the oxide semiconductor layer on the base substrate (S21), the oxide semiconductor layer is formed by a deposition or sputtering process. For instance, the oxide semiconductor layer is formed by a plasma enhanced chemical vapor deposition process.

To form the oxide semiconductor layer, a reaction material required to perform a deposition process is injected into a reaction chamber. A process pressure and a process temperature are set. And an RF power is applied to the reaction material through a power supply to make a portion of the reaction material become a gas in a plasma state (hereinafter, referred to as plasma). In the present exemplary embodiment, the reaction material includes a metal or semiconductor material, e.g., indium, gallium, zinc, tin, or an alloy thereof.

Since the plasma decreases activation energy of the reaction material, the reaction material becomes an excited state. The reaction material in the excited state includes atoms or molecules in a metastable state, in which the atoms or the molecules are separated into ion with high reactivity and radical. Thus, the plasma enhanced chemical vapor deposition method can form the thin film at a temperature lower than that of a typical chemical vapor deposition method.

The atoms or molecules in the metastable state are absorbed to the base substrate to form the oxide semiconductor layer. The atoms or molecules in the metastable state physically and chemically react to each other on the surface of the base substrate to be redistributed, and thus the atoms or molecules maintain a stable energy state. The atoms or molecules in the metastable state are absorbed to the base substrate while moving to find most stable site and making new combination.

Then, as shown in FIG. 4B, the oxide semiconductor layer is plasma treated (S22). The plasma treatment process (S22) is performed in a plasma chamber maintained in a vacuum state. In the present exemplary embodiment, the plasma treatment process (S22) is performed using a plasma enhanced chemical vapor deposition apparatus.

For instance, only the plasma is generated in the reaction chamber, in which the oxide semiconductor layer is formed, without precursor injection. The oxide semiconductor layer is plasma treated by exposing the oxide semiconductor layer to the plasma.

Then, the plasma-treated oxide semiconductor layer is heat-treated (S23) to form the channel layer. In the present exemplary embodiment, the heat treatment process includes an annealing process. The heat treatment process (S23) can be performed in various ways. For instance, the heat treatment process (S23) can be performed using a furnace or through a rapid thermal anneal (RTA) process.

FIGS. 5A to 5H are cross-sectional views showing a manufacturing method of a display substrate according to an exemplary embodiment. Hereinafter, the manufacturing method of the display substrate will be described in detail with reference to FIGS. 5A to 5H. In FIGS. 5A to 5H, the same reference numerals denote the same elements in FIGS. 1 to 4B, and thus detailed descriptions of the same elements will be omitted.

Figure 5A:
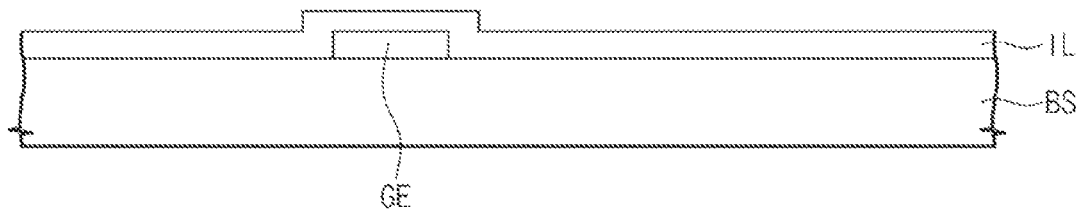
FIGS. 5A to 5H are cross-sectional views showing a manufacturing method of a display substrate according to an exemplary embodiment.

Referring to FIG. 5A, the first electrode layer is formed on the base substrate BS. The first electrode layer includes the gate electrode GE. Although not in the figures, the gate line connected to the gate electrode GE is substantially simultaneously formed with the gate electrode GE.

The gate electrode GE is formed by forming a conductive layer on the base substrate BS and patterning the conductive layer using a photolithography process. The gate electrode GE can be formed through a deposition method using a mask in which a pattern is formed.

Then, the gate insulating layer IL is formed on the gate electrode GE and the base substrate BS. The gate insulating layer IL is formed by the deposition or sputtering process. The gate insulating layer IL has a thickness determined based at least in part on a process time of the deposition or sputtering process.

Figure 5B:
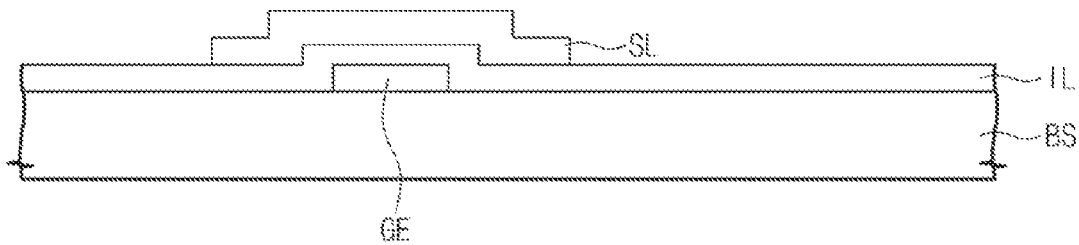

Referring to FIG. 5B, the oxide semiconductor layer SL is formed above the gate electrode GE (S10). In detail, the oxide semiconductor layer SL is formed on the gate insulating layer IL to correspond to the gate electrode GE. The oxide semiconductor layer SL is formed by a patterning, sputtering, or depositing method. For instance, the oxide semiconductor layer SL is formed by the chemical vapor deposition method.

Figure 5C:
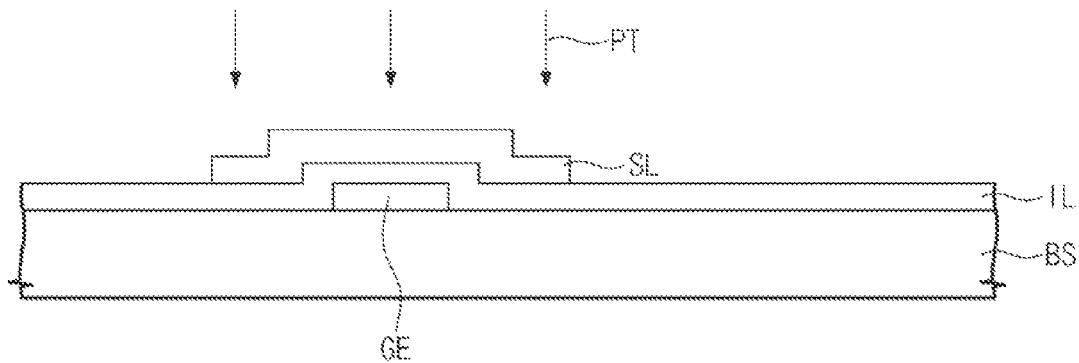
Figure 5D:
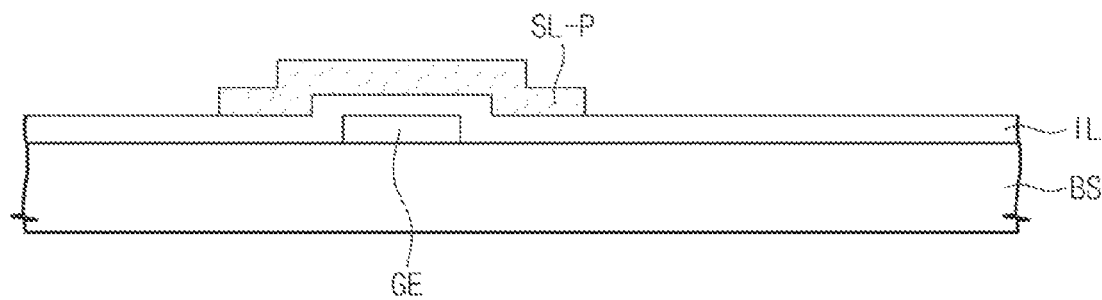

Referring to FIGS. 5C and 5D, the oxide semiconductor layer SL is plasma treated. When a predetermined plasma PT is applied to the oxide semiconductor layer SL, the oxide semiconductor layer SL reacts with the plasma PT, and thus the plasma-treated oxide semiconductor layer SL-P is formed.

The plasma PT is generated by applying a high electric field to gas. The plasma treatment process according to the present exemplary embodiment is performed using the plasma generated from nitrogen or nitric oxide.

The plasma PT is generated by maintaining the base substrate BS at a predetermined process temperature, injecting a nitrogen gas or a nitric oxide gas into the reaction chamber, and applying the high electric field in accordance with a process power. Accordingly, the plasma PT can be a nitrogen plasma or a nitric oxide plasma.

Due to the plasma treatment process (S20), defects in the oxide semiconductor layer SL are reduced and the mobility of the electric charges of the oxide semiconductor layer SL is improved. Various defects, e.g., a point defect, can be generated in the oxide semiconductor layer SL. The defects capture the electric charges moving in the oxide semiconductor layer SL, so that the mobility of the electric charges deteriorates in the oxide semiconductor layer SL.

The plasma PT applied to the oxide semiconductor layer SL decreases or neutralizes the defects, and thus the defects become inactive. Therefore, the density of the defects in the plasma-treated oxide semiconductor layer SL-P becomes small and the mobility measured in the plasma-treated oxide semiconductor layer SL-P is higher than the mobility measured in the oxide semiconductor layer SL.

In the present exemplary embodiment, when the oxide semiconductor layer SL is deposited by the chemical vapor deposition method, the plasma-treated oxide semiconductor layer SL-P is formed in the same chamber used to form the oxide semiconductor layer SL. Thus, a separate process is not required to apply the plasma PT. As a result, a manufacturing cost of the display substrate is reduced and the display substrate is prevented from being contaminated during the manufacturing process since the base substrate is not needed to move between chambers.

In the present exemplary embodiment, the mobility of the oxide semiconductor layer SL varies depending on the kind of the plasma PT, the process power, and the process temperature. In addition, the oxide semiconductor layer SL is influenced by the process time during which the oxide semiconductor layer SL is exposed to the plasma PT.

That is, the density of the defects and the mobility of the plasma-treated oxide semiconductor layer SL-P vary depending on the kind of the plasma gas, the process power, the process time, and the process temperature even though the material included in the oxide semiconductor layer SL is not changed.

Figure 5E:
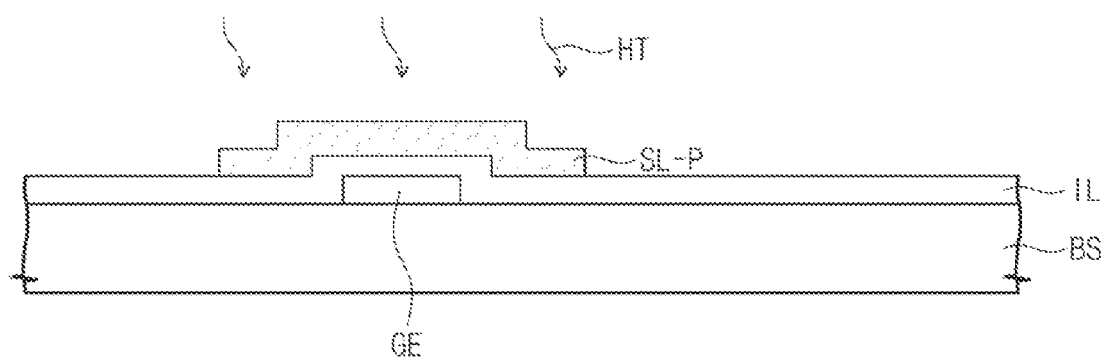
Figure 5F:
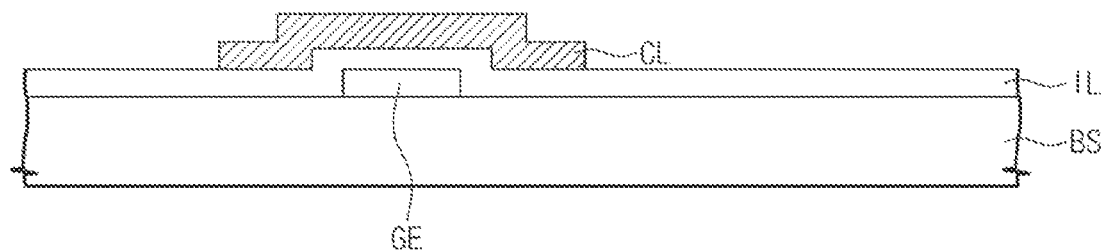

Then, referring to FIGS. 5E and 5F, the plasma-treated oxide semiconductor layer SL-P is heat-treated to form the channel layer CL. The heat treatment process is performed by the annealing process that applies heat HT to the plasma-treated oxide semiconductor layer SL-P and cools the heat-treated oxide semiconductor layer.

Due to the annealing process, the defects remaining in the plasma-treated oxide semiconductor layer SL-P are substantially uniformly diffused. The diffusion of the defects occurs to allow entropy of the oxide semiconductor layer SL-P to be lowered from energy point of view. Accordingly, the defects gradually move or are dissipated in the channel layer CL, and therefore, the channel layer CL is maintained in a stable state from energy point of view.

However, the heat treatment process should not be limited to the above-mentioned process as long as the defects in the plasma-treated oxide semiconductor layer SL-P are substantially uniformly diffused to enhance the mobility of the channel layer CL or to make the channel layer CL becomes stable.

Meanwhile, the heat treatment process can be performed at a temperature substantially equal to or lower than a crystallization temperature. For instance, when the oxide semiconductor layer SL (refer to FIG. 5B) includes the amorphous indium tin zinc oxide, the heat treatment process (S30) is performed at a temperature of about 400° C. or less. Accordingly, the channel layer CL is not crystallized and has the amorphous-crystalline structure that is the same as the crystalline structure of the oxide semiconductor layer SL.

Figure 5G:
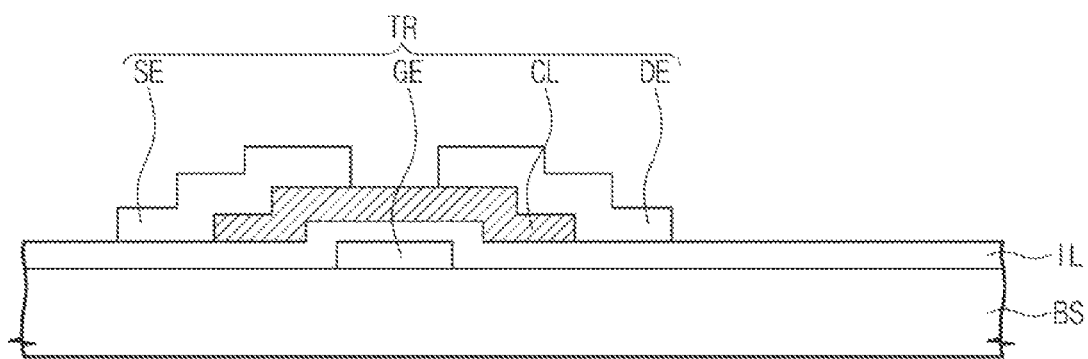

Then, referring to FIG. 5G, the second electrode layer is formed on the channel layer CL. The second electrode layer includes the source electrode SE and the drain electrode DE. Although not shown in figures, the data line connected to the source electrode SE can be substantially simultaneously formed with the source electrode SE and the drain electrode DE. The source electrode SE and the drain electrode DE are formed by forming a conductive layer (not shown) on the channel layer CL and patterning the conductive layer. As another example, the source electrode SE and the drain electrode DE can be formed through a deposition method using a mask.

Figure 5H:
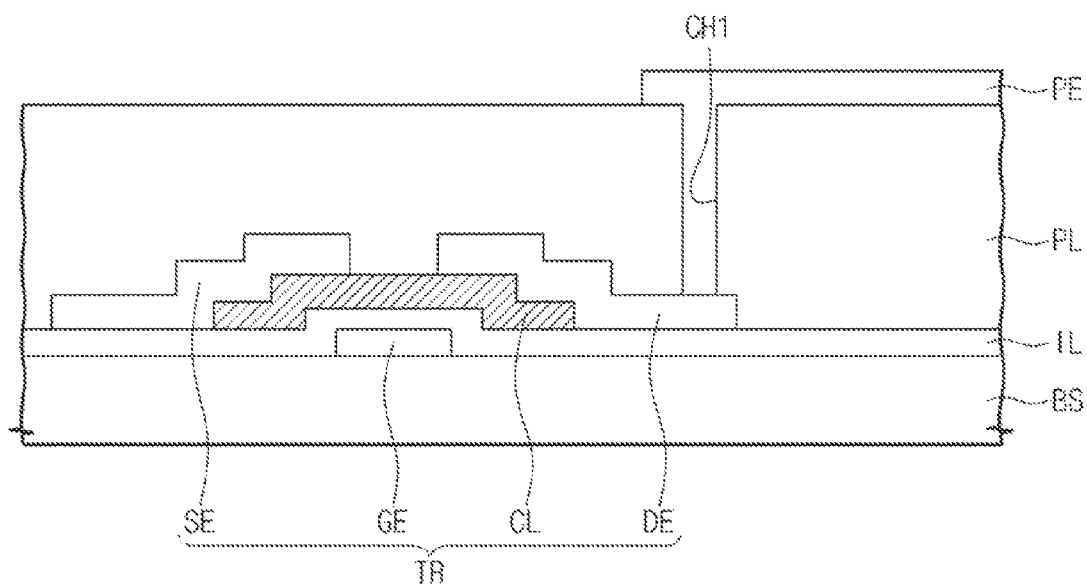

Referring to FIG. 5H, the protective layer PL is formed on the thin film transistor TR and the pixel electrode PE is formed on the protective layer PL. The display electrode PE is formed by a patterning, deposition, or photolithography process. The protective drain electrode DE is electrically connected to the pixel electrode PE through a via CH1.

The display pixel PE can serve as one electrode of the display element. For instance, the display electrode PE may be the pixel electrode of the liquid crystal capacitor LC (refer to FIG. 2). The common electrode that serves as the other electrode of the liquid crystal capacitor is formed on the display electrode PE, and a liquid crystal layer is formed between the display electrode PE and the common electrode, which is controlled by a difference in electric potential between the display electrode PE and the common electrode. The common electrode can be formed on a separate substrate.

In addition, the display electrode PE can be the anode of the organic light emitting diode OLED (refer to FIG. 2B). Although not shown in figures, a pixel definition layer including an opening formed therethrough is formed on the display pixel PE to expose the display electrode PE. The pixel definition layer is formed by patterning an inorganic layer.

Then, the organic light emitting layer is formed to fill the opening. The organic light emitting layer is provided in a liquid state and patterned through a dry process. The cathode is formed on the organic light emitting layer. The cathode is formed to cover the pixel definition layer and the organic light emitting layer. In this case, the organic layers can be further formed between the organic light emitting layer and the anode and between the organic light emitting layer and the cathode.

Figure 6A:
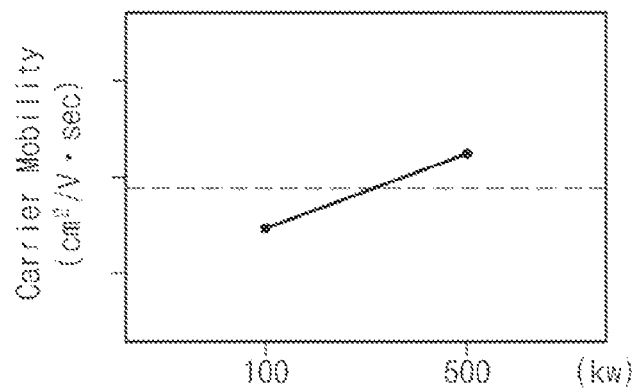
FIGS. 6A to 6C are graphs showing effects of a process condition in a plasma treatment process according to an exemplary embodiment.
Figure 6B:
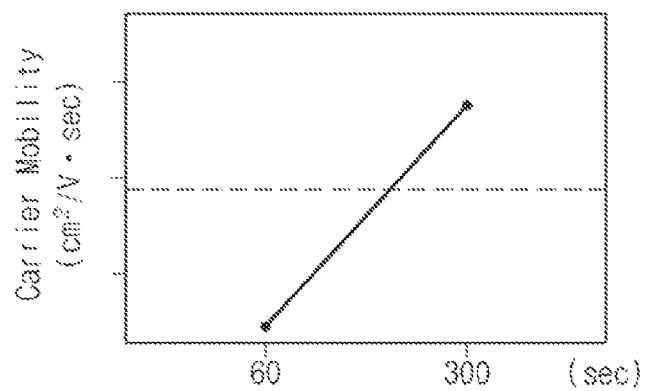
Figure 6C:
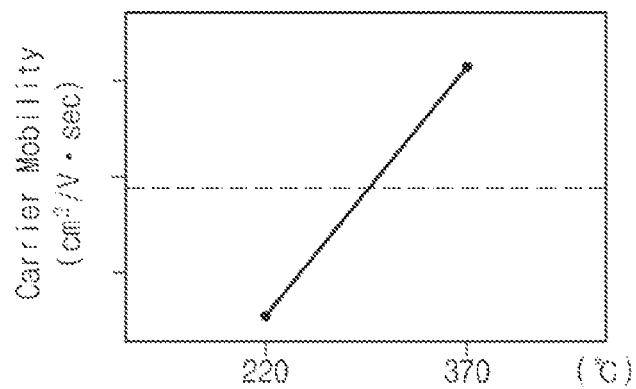

FIGS. 6A to 6C are graphs showing effects of a process condition in the nitric oxide plasma treatment process according to an exemplary embodiment. FIGS. 6A to 6C show a variation in carrier mobility of the oxide semiconductor layer in accordance with variations of the process power, the process time, and the process temperature in the nitric oxide plasma treatment process. In the present exemplary embodiment, the oxide semiconductor layer includes the amorphous indium tin zinc oxide containing about 40% of indium.

As shown in FIG. 6A, when the process power of the nitric oxide plasma increases from about 100 kW to about 500 kW, the carrier mobility of the oxide semiconductor layer increases. As shown in FIG. 6B, when the process time, in which the oxide semiconductor layer is exposed to the nitric oxide plasma, increases from about 60 seconds to about 300 seconds, the carrier mobility of the oxide semiconductor layer increases. As the process time of the oxide semiconductor layer exposed to the nitric oxide plasma becomes longer, the defects in the oxide semiconductor layer are reduced.

As shown in FIG. 6C, when the process temperature increases from about 220° C. to about 370° C., the carrier mobility of the oxide semiconductor layer increases. Consequently, the carrier mobility of the oxide semiconductor layer including the amorphous indium tin zinc oxide is proportional to the process power, the process temperature, and the process time when the oxide semiconductor layer is plasma-treated by the nitric oxide plasma as shown in FIGS. 6A to 6C.

Accordingly, when the oxide semiconductor layer is plasma-treated using the nitric plasma gas, the defects in the oxide semiconductor layer are reduced and the carrier mobility of the oxide semiconductor layer is increased by raising the power of the nitric oxide plasma, exposing the oxide semiconductor layer to the nitric oxide plasma for a long time, and increasing the process temperature.

Figure 7A:
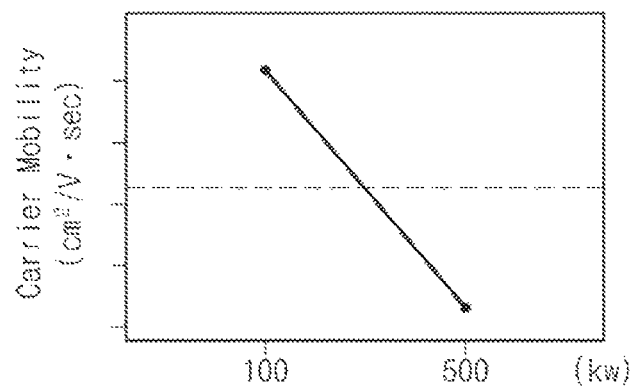
FIGS. 7A to 7C are graphs showing effects of a process condition in a plasma treatment process according to an exemplary embodiment.
Figure 7B:
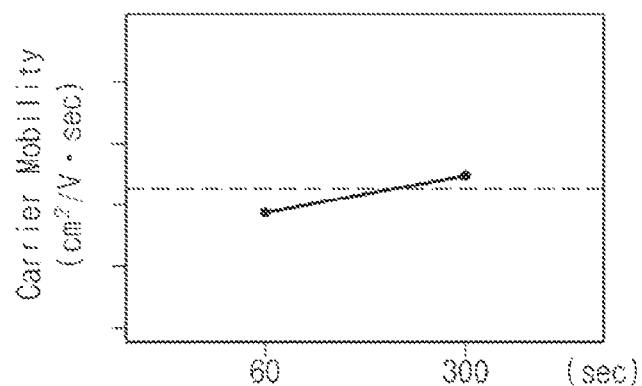
Figure 7C:
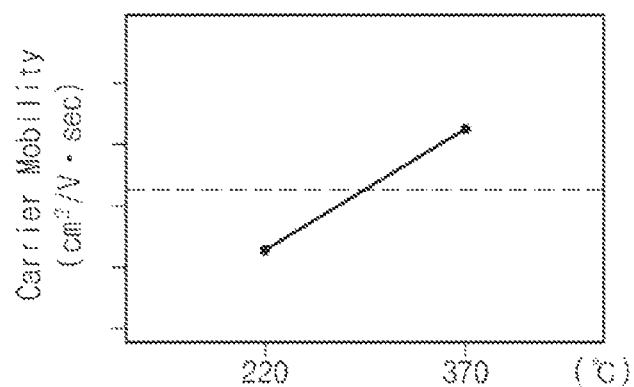

FIGS. 7A to 7C are graphs showing effects of a process condition in the nitrogen plasma treatment process according to an exemplary embodiment. FIGS. 7A to 7C show a variation in carrier mobility of the oxide semiconductor layer in accordance with variations of the process power, the process time, and the process temperature in the nitric oxide plasma treatment process. In the present exemplary embodiment, the oxide semiconductor layer includes the amorphous indium tin zinc oxide containing about 40% of indium.

As shown in FIG. 7A, when the process power of the nitric oxide plasma increases from about 100 kW to about 500 kW, the carrier mobility of the oxide semiconductor layer decreases. That is, the carrier mobility of the oxide semiconductor layer is inversely proportional to the process power of the nitrogen plasma, which is different from that of the nitric oxide plasma.

As shown in FIG. 7B, when the process time, in which the oxide semiconductor layer is exposed to the nitrogen plasma, increases from about 60 seconds to about 300 seconds, the carrier mobility of the oxide semiconductor layer increases. In addition, as shown in FIG. 7C, when the process temperature increases from about 220° C. to about 370° C., the carrier mobility of the oxide semiconductor layer increases.

Consequently, the carrier mobility of the oxide semiconductor layer including the amorphous indium tin zinc oxide is proportional to the process temperature and the process time. The carrier mobility is inversely proportional to the process power when the oxide semiconductor layer is plasma-treated by the nitrogen plasma as shown in FIGS. 7A to 7C. Accordingly, when the oxide semiconductor layer is plasma-treated using the nitrogen plasma gas, the carrier mobility of the oxide semiconductor layer is increased by lowering the power of the nitrogen plasma and increasing the process time and the process temperature.

For instance, when the oxide semiconductor layer formed of the amorphous indium tin zinc oxide containing about 40% of indium is exposed to the nitrogen plasma with the power of about 200 kW at the temperature of about 370° C. during about 300 seconds, the thin film transistor having the carrier mobility of about 35 $cm^2$/V·sec or more can be formed.

Figure 8A:
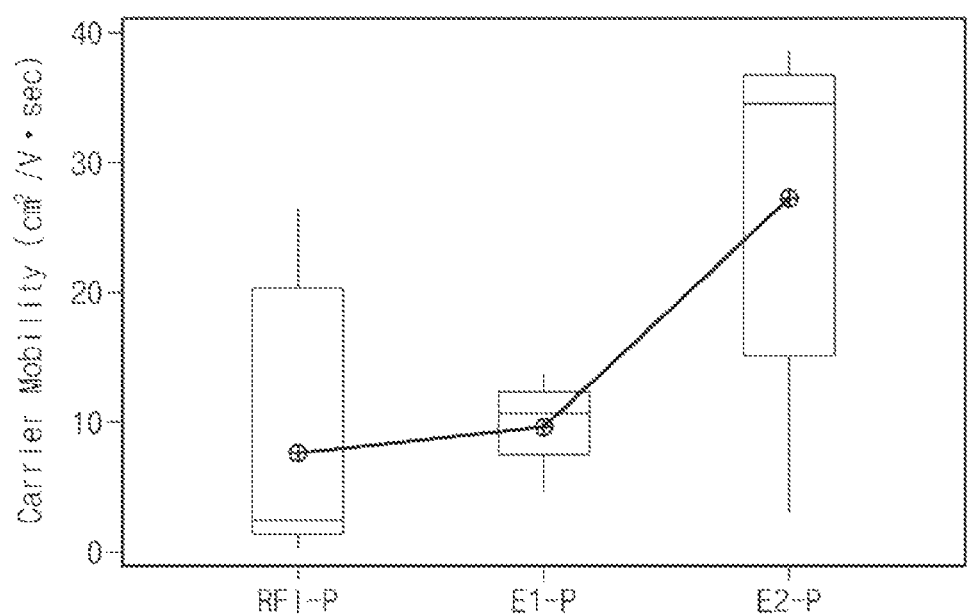
FIG. 8A is a graph showing an effect according to a plasma treatment process performed on an oxide semiconductor layer according to an exemplary embodiment.
Figure 8B:
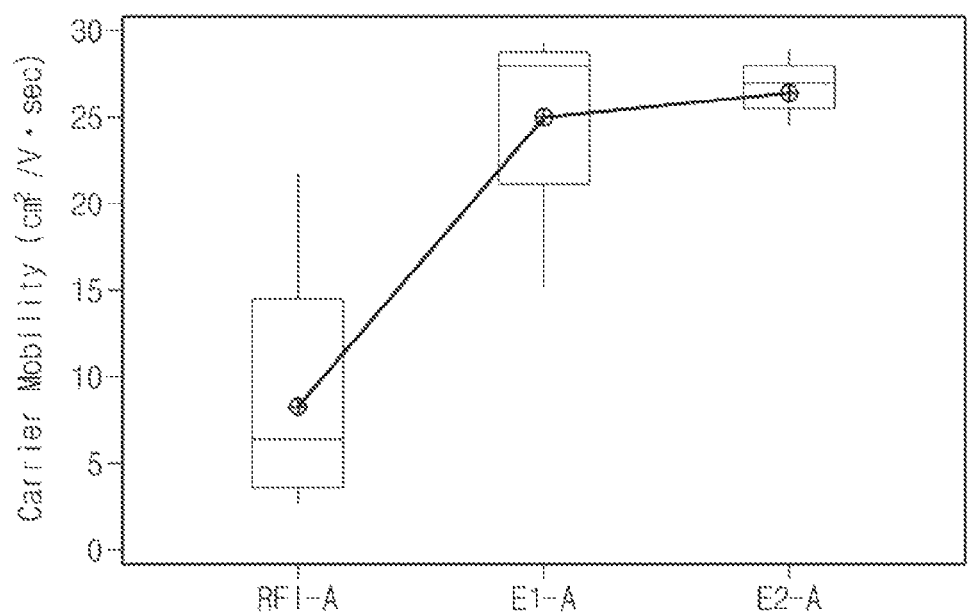
FIG. 8B is a graph showing an effect according to an annealing process performed on an oxide semiconductor layer according to an exemplary embodiment.
Figure 8C:
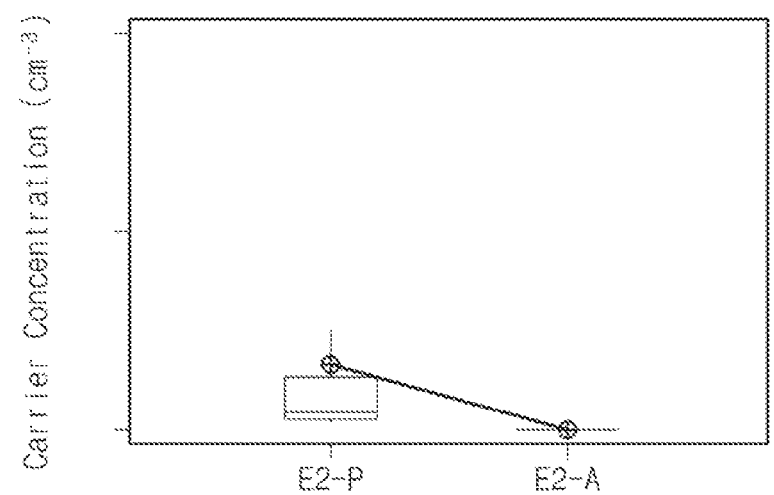
FIG. 8C is a graph showing a concentration of carriers in a channel layer according to an exemplary embodiment.
Figure 8D:
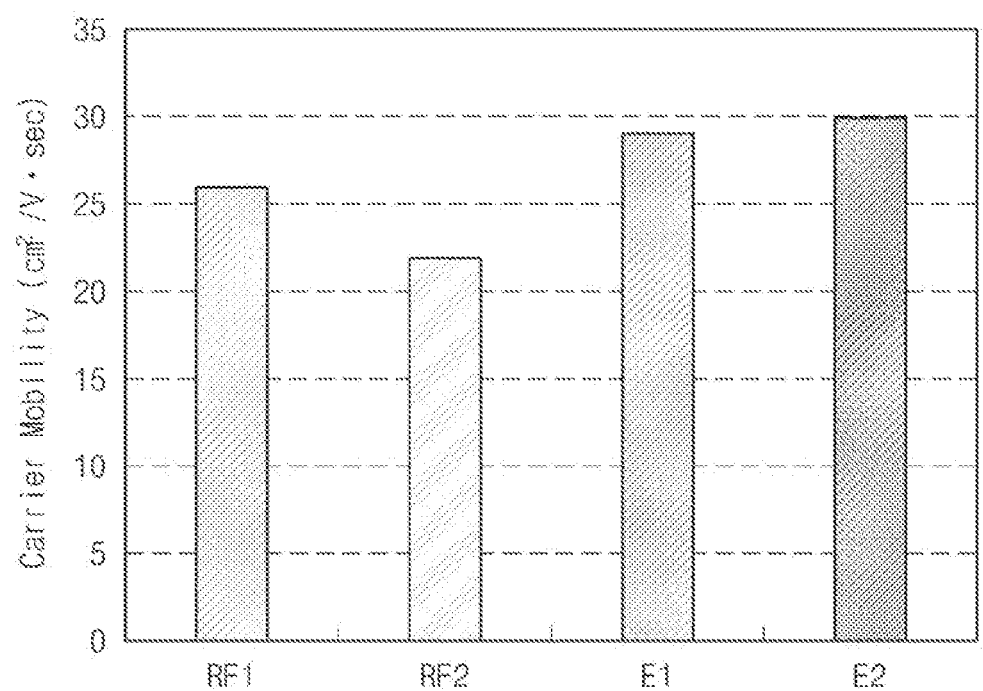
FIG. 8D is a graph showing a variation of hole mobility in a channel layer according to an exemplary embodiment.

FIG. 8A is a graph showing an effect according to a plasma treatment process performed on an oxide semiconductor layer according to an exemplary embodiment. FIG. 8B is a graph showing an effect according to an annealing process performed on an oxide semiconductor layer according to an exemplary embodiment. FIG. 8C is a graph showing a concentration of carriers in a channel layer according to an exemplary embodiment. FIG. 8D is a graph showing a variation of hole mobility in a channel layer according to an exemplary embodiment.

FIGS. 8A to 8D show an average value and a scattering degree using measured values after the oxide semiconductor formed of the amorphous indium tin zinc oxide containing about 40% of indium is plasma-treated by different plasmas. Hereinafter, a carrier mobility of the thin film transistor will be described with reference to FIGS. 8A to 8D.

In FIGS. 8A to 8D, a first comparison example RF1 and first and second embodiment examples E1 and E2 are compared to each other. The first comparison example RF1, the first embodiment example E1, and the second embodiment example E2 include thin film layers configured to include the same oxide semiconductor and are plasma-treated using different plasma gases.

The first comparison example RF1 is plasma-treated using argon gas plasma, the first embodiment example E1 is plasma-treated using the nitric oxide gas plasma, and the second embodiment example E2 is plasma-treated using the nitrogen gas plasma.

Referring to FIGS. 8A and 8B, no variation in the hole mobility between an example RF1-P obtained by plasma-treating the first comparison example RF1 using the argon gas plasma and an example RF1-A obtained by annealing the example RF1-P is observed. When the annealing process is performed on the example RF1-P, the scattering degree is reduced, but the number of times in which the hole mobility increases is reduced.

Different from the above, the hole mobility of the example E1-A obtained by performing the nitric oxide plasma treatment process and the annealing process on the first embodiment example E1 is rapidly increased compared to that of the example E1-P obtained by performing only the plasma treatment process on the first embodiment example E1. The scattering degree is slightly increased, but the average hole mobility is increased about two times.

In the case of the second embodiment example E2, the variation in the hole mobility between an example E2-P obtained by plasma-treating the second embodiment example E2 using the nitrogen gas plasma and an example E2-A obtained by annealing the example E2-P is small. However, the scattering degree in the second embodiment example E2 is rapidly decreased by the annealing process. The effects in the second embodiment example E2 will be described with reference to FIG. 8C.

FIG. 8C shows the carrier concentration of the oxide semiconductor layer of the second embodiment example E2 plasma-treated by the nitrogen plasma and the carrier concentration of the oxide semiconductor layer on which the annealing process is performed.

As shown in FIG. 8C, when the oxide semiconductor layer is annealed after being plasma-treated by the nitrogen plasma, the carrier concentration in the oxide semiconductor layer is reduced. The hole mobility is inversely proportional to the carrier concentration in the oxide semiconductor layer.

Referring to FIGS. 8A to 8C, the second embodiment example E2-A, which is annealed after being plasma-treated, has the hole mobility of about 23 $cm^2$/V·sec or more, and thus the hole mobility is more effectively improved and stably maintained than the second embodiment example E2-P on which only the plasma-treatment process is performed. The carrier concentration in the oxide semiconductor layer annealed after being plasma-treated is reduced, and thus the scattering degree is reduced such that the hole mobility of the oxide semiconductor layer is increased.

That is, when the annealing process is performed after the nitrogen plasma process is performed, the hole mobility is more effectively and stably increased than when the oxide semiconductor layer is plasma-treated using the nitric oxide plasma. Consequently, when the annealing process is performed after the nitrogen plasma process is performed, the thin film transistor has high hole mobility, and thus yield and reliability of the thin film transistor can be improved.

FIG. 8D further shows a second comparison example RF2 on which no plasma treatment process is performed. In detail, FIG. 8D shows an average value obtained by measuring the carrier mobility after the first and second comparison examples RF1 and RF2 and the first and second embodiment examples E1 and E2 are annealed.

As shown in FIG. 8D, the first and second embodiment examples E1 and E2 have the hole mobility higher than that of the first and second comparison examples RF1 and RF2. This is because the hole mobility of the oxide semiconductor layer is improved by the annealing process after the nitrogen plasma treatment process or the nitric oxide plasma treatment process.

Meanwhile, the first comparison example RF1 plasma-treated by the argon plasma has the hole mobility lower than that of the second comparison example RF2 that is not plasma-treated. This is because the argon plasma treatment process performed on the first comparison example RF1 causes a deterioration of the hole mobility.

Although not shown in figures, a precipitate of indium oxide or zinc oxide is formed in the channel layer CL plasma-treated by the argon plasma. The precipitate disturbs the movement of the carrier in the channel layer CL and causes deterioration in electrical properties of the thin film transistor TR. Therefore, the manufacturing method of the thin film transistor TR according to the present disclosure does not include the argon plasma treatment process as the plasma treatment process.

Figure 9:
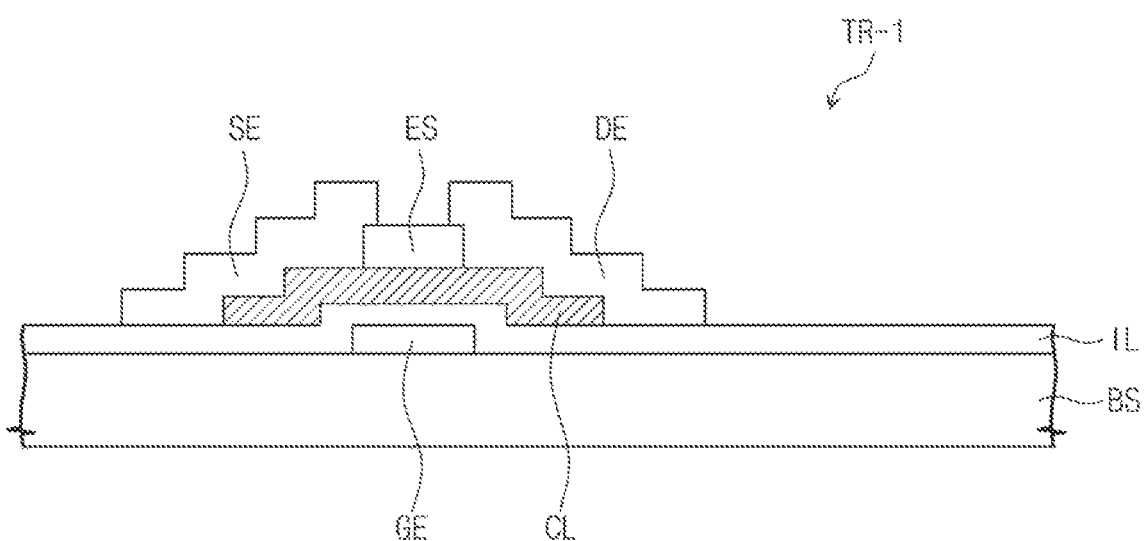
FIG. 9 is a cross-sectional view showing a thin film transistor according to an exemplary embodiment.

FIG. 9 is a cross-sectional view showing a thin film transistor TR-1 according to an exemplary embodiment. In FIG. 9, the same reference numerals denote the same elements in FIG. 3, and thus detailed descriptions of the same elements will be omitted.

Referring to FIG. 9, the thin film transistor TR-1 further includes an etch stopper ES. The etch stopper ES is disposed to overlap with the gate electrode GE when viewed in a plan view. The etch stopper ES covers a portion of the channel layer CL, which is exposed between the source electrode SE and the drain electrode DE.

The etch stopper ES is formed of an inorganic layer. For instance, the etch stopper ES includes a silicon nitride layer.

In an embodiment, the etch stopper ES prevents the channel layer CL from being damaged while the source electrode SE and the drain electrode DE are formed through an etching process. In addition, the etch stopper ES prevents the channel layer CL from being oxidized when the protective layer is formed on the thin film transistor TR.

Meanwhile, the processes of forming the thin film transistor TR-2 are similar to the processes shown in FIGS. 5A to 5H. However, a process of forming the etch stopper ES on the channel layer CL is performed before the source electrode SE and the drain electrode DE are formed.

The etch stopper ES is formed by forming the silicon nitride layer on the channel layer CL and patterning the silicon nitride layer. Each of the source electrode SE and the drain electrode DE is formed to cover a portion of the etch stopper ES.

Figure 10A:
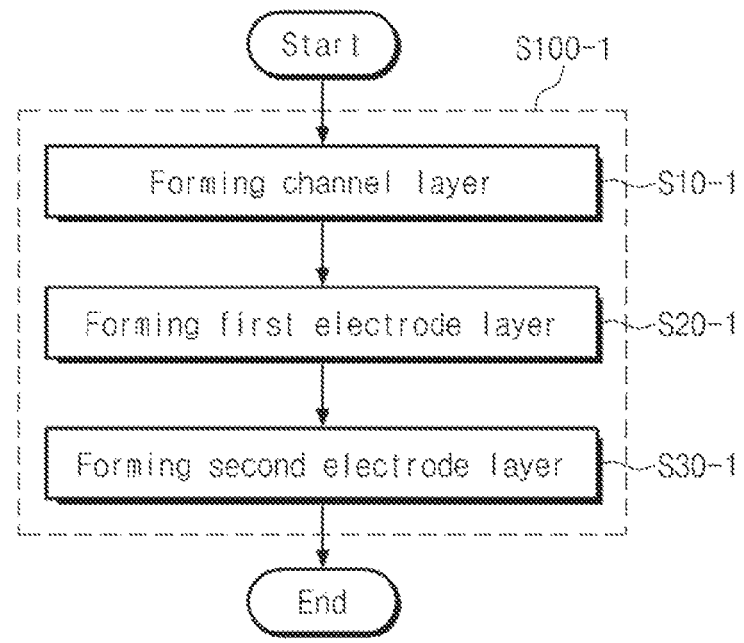
FIG. 10A is a flowchart showing a manufacturing method of a thin film transistor according to an exemplary embodiment.
Figure 10B:
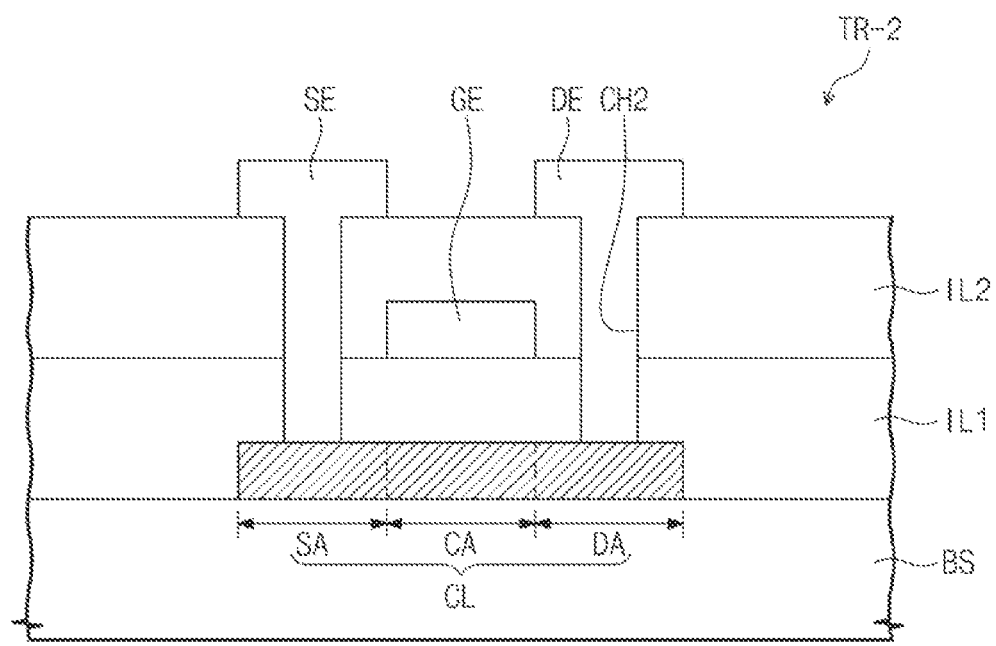
FIGS. 10B and 10C are cross-sectional views showing a thin film transistor according to an exemplary embodiment.
Figure 10C:
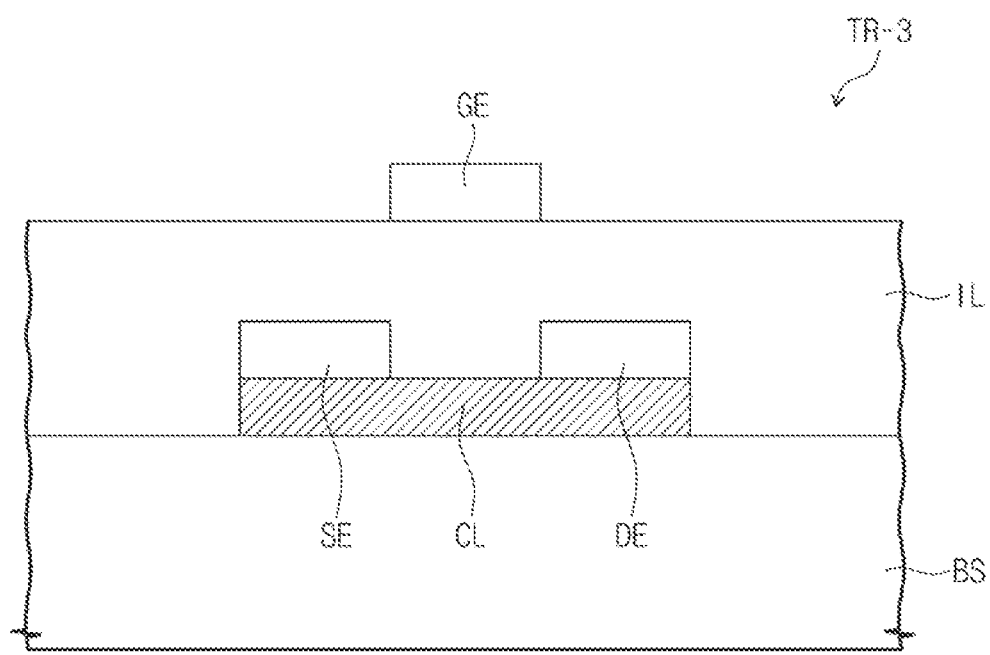

FIG. 10A is a flowchart showing a manufacturing method of a thin film transistor according to an exemplary embodiment. FIGS. 10B and 10C are cross-sectional views showing a thin film transistor according to an exemplary embodiment. FIGS. 10B and 10C show thin film transistors TR-2 and TR-3 manufactured by the manufacturing method shown in FIG. 10A. Hereinafter, the thin film transistors TR-2 and TR-3 will be described in detail with reference to FIGS. 10A to 10C. Depending on the embodiment, additional states can be added, others removed, or the order of the states changed in FIG. 9.

Referring to FIG. 10A, the manufacturing method S100-1 of the thin film transistor according to the present exemplary embodiment includes forming a channel layer (S10-1), forming a first electrode layer (S20-1), and forming a second electrode layer (S30-1). The manufacturing method S100-1 of the thin film transistor is the same as the manufacturing method S100 of the thin film transistor shown in FIG. 4A except for the order of the processes.

As shown in FIGS. 10B and 10C, the thin film transistors TR-2 and TR-3 have a top gate structure. The thin film transistors TR-2 and TR-3 having the top gate structure block the light provided from an upper portion thereof and prevent the channel layer CL from being damaged due to the light.

Referring to FIG. 10B, the channel layer CL is formed on the base substrate BS. An insulating layer IL1 is formed on the channel layer CL to electrically insulate the gate electrode GE from the channel layer CL.

The channel layer CL includes a channel area CA, a source area SA, and a drain area DA when viewed in a plan view. The channel area CA includes a channel through which the carriers move. The source area SA and the drain area DA are spaced apart from each other and the channel area CA is formed between the source area SA and the drain area DA.

Although not shown in the figures, the forming (S20-1) of the channel layer CL can further include reduction of the source area SA and the drain area DA. Due to the reduction of the source area SA and the drain area DA, a precipitate can be formed on the surface of the source area SA and the drain area DA.

Then, the first electrode layer is formed on the channel layer CL. The first electrode layer includes the gate electrode GE and the second electrode layer includes the source electrode SE and the drain electrode DE. Due to the processes shown in FIG. 10A, the gate electrode GE is disposed on the channel layer CL.

The gate electrode GE is disposed to overlap with the channel area CA. In this case, the process of forming the insulating layer IL1 can be further performed before the process of forming the first electrode layer S20-1. The insulating layer IL1 electrically insulates the gate electrode GE from the channel layer CL.

The process of forming an insulating layer IL2 can be further performed before the process of forming the source electrode and the drain electrode (S30-1). The gate electrode GE is electrically insulated by the insulating layer IL2.

The source electrode SE and the drain electrode DE are disposed on the insulating layer IL2. In this case, a process of forming a contact hole CH2 can be performed before the process of forming the source electrode and the drain electrode (S30-1). The contact hole CH2 is formed penetrating through the insulating layers IL1 and IL2.

Then, the source electrode SE and the drain electrode DE are formed on the insulating layer IL2. The source electrode SE is electrically connected to the source area SA and the drain electrode DE is electrically connected to the drain area DA.

As shown in FIG. 10C, the source electrode SE and the drain electrode DE are directly disposed on the channel layer CL. In this case, the first electrode layer includes the source electrode SE and the drain electrode DE and the second electrode layer includes the gate electrode GE. The gate electrode GE is disposed on the source electrode SE and the drain electrode DE.

The source electrode SE and the drain electrode DE are disposed on the channel layer CL and spaced apart from each other. Different from the thin film transistor TR-2 shown in FIG. 10B, the process of forming the contact hole CH2 can be omitted from the manufacturing method of the thin film transistor TR-3.

The thin film transistor according to the present disclosure can have various structures.

Although exemplary embodiments of the described technology have been described, it is understood that the present invention should not be limited to these exemplary embodiments but various changes and modifications can be made by one ordinary skilled in the art within the spirit and scope of the present invention as hereinafter claimed.

What is claimed is:

1. A method of manufacturing a thin film transistor for a display device, comprising:
   forming an oxide semiconductor layer on a substrate;
   plasma-treating the oxide semiconductor layer with a plasma generated from a nitrogen gas or a nitric oxide gas so as to decrease defects in the oxide semiconductor layer; and
   annealing the plasma-treated oxide semiconductor layer to form a channel layer.

2. The method of claim 1, wherein the oxide semiconductor layer comprises an amorphous oxide semiconductor material and the channel layer comprises the amorphous oxide semiconductor material.

3. The method of claim 2, wherein the annealing is performed at a temperature of about 400° C. or less.

4. The method of claim 2, wherein the oxide semiconductor layer is formed of indium, gallium, zinc, tin, or an oxide thereof.

5. The method of claim 1, wherein the forming of the oxide semiconductor layer and the plasma-treating of the oxide semiconductor layer are performed using a plasma enhanced chemical vapor deposition apparatus.

6. The method of claim 1, further comprising:
   forming a gate electrode on the channel layer; and
   forming source and drain electrodes electrically connected to the channel layer.

7. The method of claim 1, further comprising:
   forming a gate electrode on the substrate before the forming of the oxide semiconductor layer; and
   forming source and drain electrodes electrically connected to the channel layer.

8. The method of claim 7, further comprising forming an etch stopper on the channel layer before the forming of the source and drain electrodes, wherein the etch stopper is partially exposed between the source electrode and the drain electrode.

9. A method of manufacturing a display substrate, comprising:
   forming a thin film transistor on a substrate; and
   forming a display element on the substrate, wherein the display element is electrically connected to the thin film transistor, and wherein the forming of the thin film transistor comprising comprises:
      forming an oxide semiconductor layer on the substrate;
      plasma-treating the oxide semiconductor layer using a plasma generated from a nitrogen gas or a nitric oxide gas to decrease defects in the oxide semiconductor layer; and
      annealing the plasma-treated oxide semiconductor layer to form a channel layer.

10. The method of claim 9, wherein each of the oxide semiconductor layer and the channel layer is formed of an amorphous oxide semiconductor material.

11. The method of claim 10, wherein the annealing is performed at a temperature of about 400° C. or less.

12. The method of claim 9, further comprising:
   forming a gate electrode on the substrate before the forming of the oxide semiconductor layer; and
   forming source and drain electrodes electrically connected to the channel layer.

13. The method of claim 12, wherein the forming of the display element comprises forming a pixel electrode on the thin film transistor, and wherein the pixel electrode is electrically connected to the drain electrode.

14. The method of claim 9, further comprising:
   forming a gate electrode on the channel layer so as to overlap with the channel layer; and
   forming source and drain electrodes electrically connected to the channel layer.

15. The method of claim 14, wherein the forming of the display element comprises forming an organic light-emitting diode on the thin film transistor, and wherein the organic light-emitting diode is electrically connected to the drain electrode.

16. A method of manufacturing a thin film transistor for a display device, comprising:
   forming an oxide semiconductor layer on a substrate in a chamber;
   injecting nitrogen gas or nitric oxide gas into the chamber;
   plasma-treating the oxide semiconductor layer with a plasma generated from the nitrogen gas or the nitric oxide gas; and
   annealing the plasma-treated oxide semiconductor layer to form a channel layer, wherein the forming, injecting, plasma-treating and annealing are performed without removing the substrate from the chamber.

17. The method of claim 16, wherein each of the oxide semiconductor layer and the channel layer is formed of an amorphous oxide semiconductor material.

18. The method of claim 16, wherein the annealing is performed at a temperature of about 400° C. or less.

19. The method of claim 16, further comprising:
   forming a gate electrode over the substrate before the forming of the oxide semiconductor layer; and
   forming source and drain electrodes electrically connected to the channel layer.

20. The method of claim 19, further comprising forming an etch stopper over the channel layer before the forming of the source and drain electrodes, wherein the etch stopper is partially exposed between the source electrode and the drain electrode.

21. The method of claim 1, wherein the forming, plasma-treating and annealing are performed in a chamber and without removing the substrate from the chamber.

* * * * *